United States Patent [19]
Fulford, Jr. et al.

[11] Patent Number: 6,072,192
[45] Date of Patent: Jun. 6, 2000

[54] TEST STRUCTURE RESPONSIVE TO ELECTRICAL SIGNALS FOR DETERMINING LITHOGRAPHIC MISALIGNMENT OF VIAS RELATIVE TO ELECTRICALLY ACTIVE ELEMENTS

[75] Inventors: H. Jim Fulford, Jr., Austin; Mark I. Gardner, Cedar Creek; Fred N. Hause, Austin, all of Tex.

[73] Assignee: Advanced Micro Devices, Inc., Sunnyvale, Calif.

[21] Appl. No.: 09/252,365

[22] Filed: Feb. 18, 1999

Related U.S. Application Data

[62] Division of application No. 08/925,382, Sep. 8, 1997, Pat. No. 5,916,715.

[51] Int. Cl.[7] .......................... H01L 23/58; H01L 23/544
[52] U.S. Cl. .............................................. 257/48; 257/797
[58] Field of Search ....................... 257/48, 797; 438/14, 438/17, 401, 975, 18

[56] References Cited

U.S. PATENT DOCUMENTS

| | | | |
|---|---|---|---|
| 3,751,647 | 8/1973 | Maeder et al. | 713/401 |
| 3,842,491 | 10/1974 | Depuy et al. | 438/14 |
| 5,553,274 | 9/1996 | Liebmann | 395/500.22 |
| 5,705,301 | 1/1998 | Garza et al. | 430/5 |
| 5,707,765 | 1/1998 | Chen | 430/5 |
| 5,723,233 | 3/1998 | Garza et al. | 430/5 |
| 5,773,315 | 6/1998 | Jarvis | 438/14 |
| 5,861,679 | 1/1999 | Nagano | 257/797 |

*Primary Examiner*—Tom Thomas
*Assistant Examiner*—Hung Kim Vu
*Attorney, Agent, or Firm*—Kevin L. Daffer; Conley, Rose & Tayon

[57] ABSTRACT

The present invention advantageously provides a method for determining lithographic misalignment of a via relative to an electrically active area. An electrically measured test structure is provided which is designed to have targeted via areas shifted from the midline(s) of a targeted active area(s). Further, the test structure is designed to have a test pad(s) that electrically communicates with the targeted active area (s). Design specifications of the test structure require the targeted via areas to be offset from the midline(s) of the active area(s) by varying distances. The above-mentioned method involves processing the designed test structure. An electrical signal may then be applied to conductors coupled to each of the vias while it is also being applied to the test pad. The resulting electrical response should be proportional to the distance that a via is misaligned from its desired location. Using the electrical responses for all the vias, it is possible to determine the direction and amount of misalignment.

10 Claims, 6 Drawing Sheets

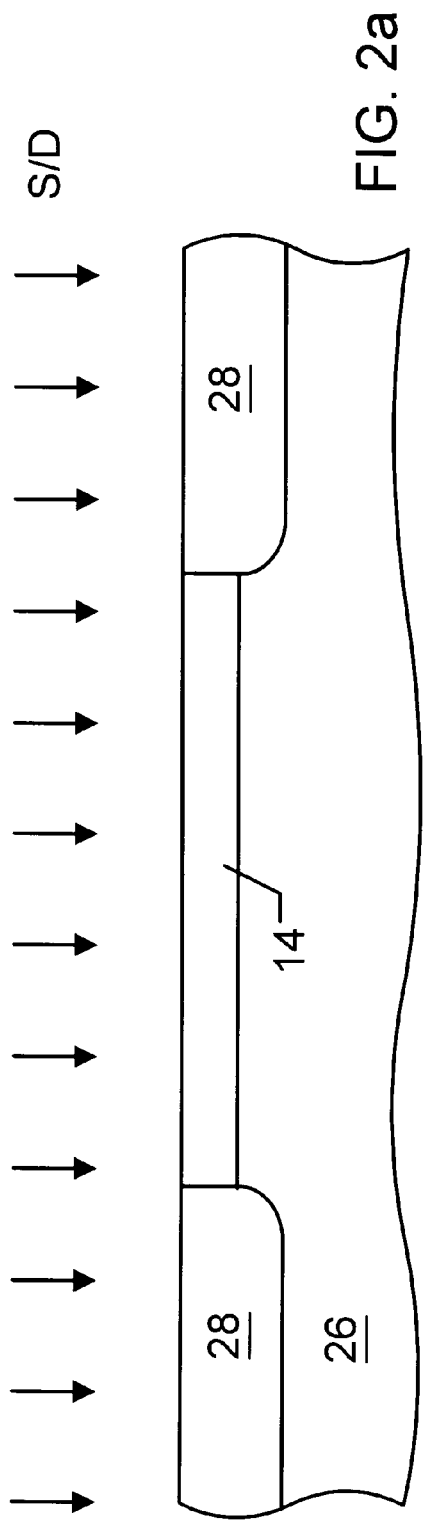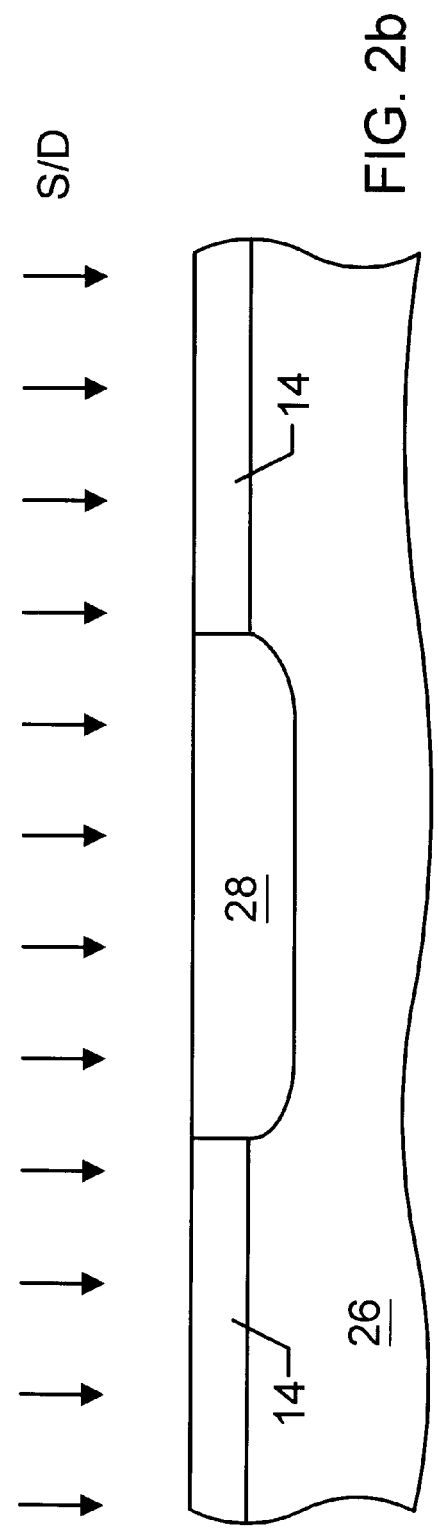

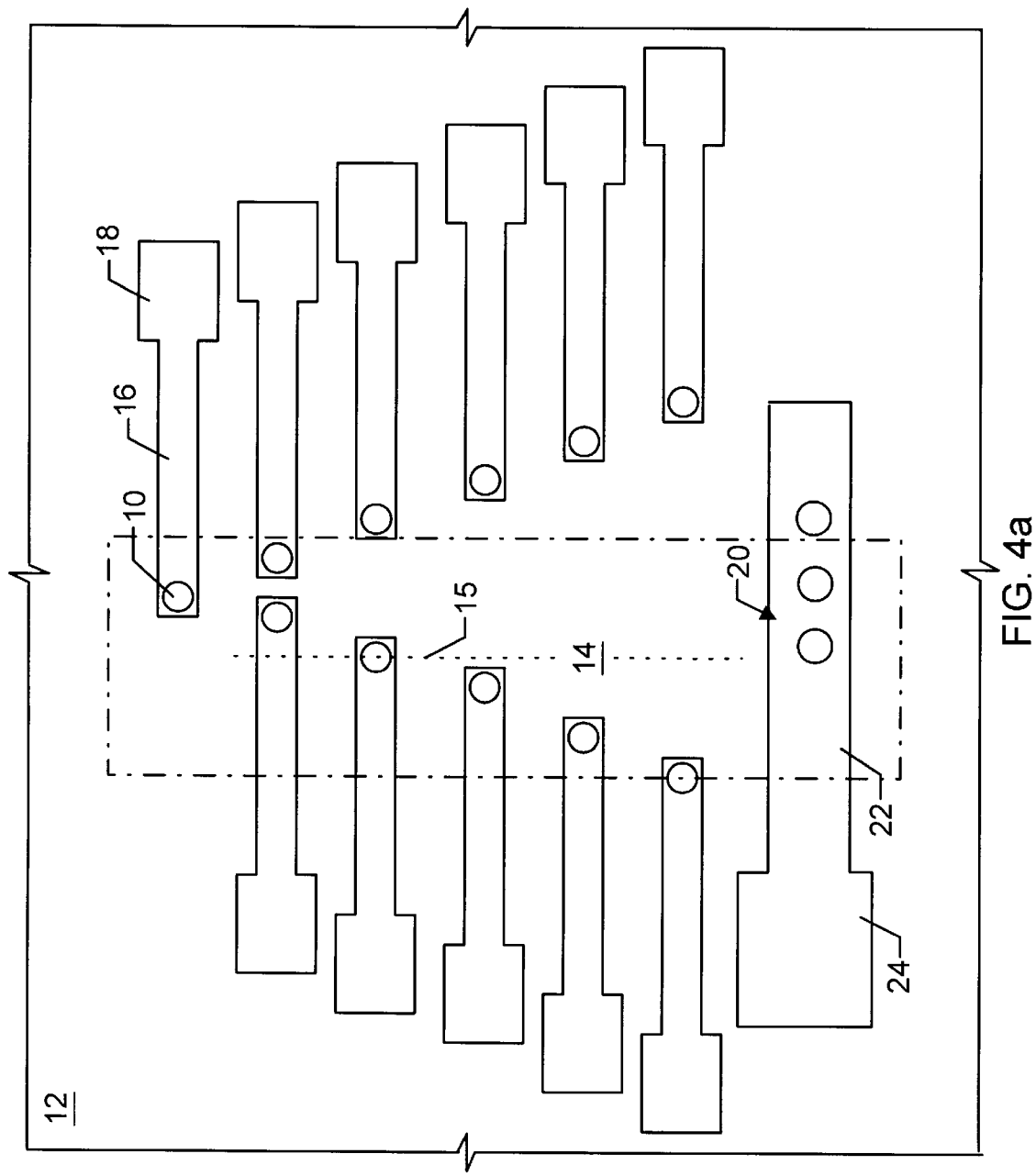

TEST STRUCTURE RESPONSIVE TO ELECTRICAL SIGNALS FOR DETERMINING LITHOGRAPHIC MISALIGNMENT OF VIAS RELATIVE TO ELECTRICALLY ACTIVE ELEMENTS

This is a Division of application Ser. No. 08/925,382, filed Sep. 8, 1997, U.S. Pat. No. 5,916,715.

BACKGROUND OF THE INVENTION

1. Field of the Invention

This invention relates to integrated circuit fabrication and, more particularly, to an electrically measurable test structure that may be used to determine lithographic misalignment of vias relative to electrically active elements employed by the integrated circuit.

2. Description of the Related Art

Modern integrated circuits contain numerous structures or features, typically the size of a few micrometers. The features are placed in localized areas, and are either conductive, non-conductive or semi-conductive (i.e., rendered conductive in defined areas with dopants). A technique known as photolithography or "lithography" is used to place such features. Lithography entails radiation used to pattern a photosensitive film. An optical image is transferred to the film from a patterned mask placed in proximity to the film. The photosensitive film, i.e., "photoresist" has two main properties. First, solubility of the resist changes in response to it being exposed to appropriate radiation. Second, a hardened resist is resistant to attack by an etchant capable of removing selectively exposed conductive and/or insulative material.

According to a sequence of lithographic steps, the resist is first applied to a semiconductor topography. Next, a partially transparent mask is placed in proximity to the topography. Patterns upon the mask are projected upon the topography using various forms of radiation. Ultraviolet light is the primary form of radiation that is used, but x-rays and electron beams are growing in popularity. The radiation is transmitted through only the transparent portions of the mask plate to the photoresist film. The resist solubility of regions that are exposed to radiation is altered by a photochemical reaction. The selectively exposed resist is then washed with a solvent that preferentially removes the resist areas of higher solubility. Subsequently, the now patterned resist is exposed to an etchant that removes those portions of the topography unprotected (i.e., not covered) by the resist. Finally, the photoresist film is removed, leaving a duplicate of the mask plate pattern etched into the substrate film.

During photolithography, it is necessary that the mask plate pattern be properly aligned relative to previously formed patterns upon the topography prior to being exposed to radiation. Typically, alignment is performed using a structure known as an "alignment mark". The alignment mark includes an alignment target that is formed in a layer of the topography (henceforth referred to as "substrate"). An alignment guide formed within the mask plate can then be visually or optically aligned with the alignment mark. Alignment is achieved by moving the mask plate until the alignment guide and the Alignment target are correctly positioned with respect to each other. Perfect alignment of the patterned substrate to the desired image to be printed is rarely achieved.

Several factors limit alignment accuracy. For example, the step-and-repeat method used to form a pattern upon the mask plate by its nature leads to alignment errors across the mask. This method involves repeatedly imaging a master device pattern, i.e., reticle, on the mask plate to build a rectangular array. Proper alignment of two layers requires that the corresponding mask plates of the two layers have identical arrays, which is difficult to achieve. Further, the imaged size of the mask pattern may be slightly expanded or contracted in a linear manner relative to the substrate pattern. Expansion of the image can result during the step-and-repeat method or during photolithography. Contraction of the image may be a result of thermal expansion of the substrate or the mask plate. Even if the mask and substrate dimensions are correct, the equipment used for alignment of the mask plate to the wafer topography often makes errors.

In whatever form, proper alignment is necessary to avoid failure of devices employed across an integrated circuit. For instance, if vias (i.e., conductive plugs or openings placed through interlevel dielectrics) are not properly positioned over conductive or semi-conductive elements (henceforth referred to as "electrically active areas"), integrated circuit devices that should electrically communicate with each other may, in the extreme, actually be electrically isolated from each other. Even if the extreme scenario does not occur, slight misalignment of the via to an active area may cause devices to receive voltages or current less than the designed or targeted amount.

Optimum alignment of each layer to previously patterned layers is particularly necessary as the number of layers within an integrated circuit increases. To ensure that a lithographic system is performing accurate alignment during fabrication, a test structure is often formed directly upon the wafer itself. The test structure contains features, such as active areas and contacts. Distance measurements are then made to determine how far features of the test circuit are shifted from their desired or targeted locations. Such measurements are often performed using an optical measurement system such as a scanning electron microscope ("SEM"). Unfortunately, these type of measurements are often time consuming. Further, accuracy of measurements made using an optical system may be limited by the resolution of the system or ability of the system to distinguish closely spaced objects.

It is therefore desirable to develop a test structure and method which can more rapidly determine misalignment than optical techniques. Such a method would prove beneficial in possibly locating the source of misalignment, and therefore allow for corrective measures to be taken to prevent future misalignment problems. A test structure is needed that not only discerns misalignment, but also quantifies misalignment and the direction of misalignment. Quantifying the amount and direction of misalignment provides indicia to an operator necessary for him or her to adjust for the misalignment on future wafer runs. The improved test structure might beneficially be employed prior to a wafer run, or between wafer runs to allow adjustment for subsequent lithographic alignments.

SUMMARY OF THE INVENTION

The problems outlined above are in large part solved by the alignment test structure hereof, and a method for determining lithographic misalignment using such a test structure. That is, a test structure is provided which is designed to have targeted via areas shifted from the midline of a corresponding targeted electrically active area. The electrically active area can be, according to one embodiment, an implanted area within a semiconductor substrate or, if multi-layered structures are employed, a metallic conductor.

Regardless of its form or structure, the active area is one that is conductive or is rendered conductive, to which a via is to be aligned thereover. As used hereinafter, "targeted" areas are those areas designed to receive a feature, such as a via, an active area. or a conductor. In most instances, the layout dictates where the targeted areas are located. It is desired that the targeted areas correspond to the actual fabricated areas upon the mask and semiconductor topography. However, this is rarely the case. During mask production or during lithography upon the topography, the via or conductor ends up being at locations shifted from the targeted area, an occurrence known as misalignment.

The present test structure is designed to have a test pad that electrically communicates with the targeted electrically active area. Design specifications of the test structure require the via areas to be offset from the midline(s) of one or more electrically active areas by varying distances. As defined herein, the midline is the (central axis along which the electrically active area extends. The lateral edges of such an active area extend equal distances from the midline as fabricated upon the substrate. Some of the targeted via areas are strategically placed so that they are removed completely from the targeted active area. The locations of other targeted via areas are selected so that the via areas partially overlap the active area.

It is recognized that the test structure contains target feature areas i.e., targeted via areas and active areas. Thus, the test structure is purposefully drawn or "laid out" such that the targeted via and active areas are shifted with respect to each other. Where the actual features will eventually reside depends upon the direction and magnitude of lithographic misalignment. Misalignment during production of vias and active areas upon the topography may add to the shift or subtract from the shift. The present test structure is designed to quantify misalignment and the direction of misalignment given the amount of pre-existing, targeted shift.

In one embodiment, the above-described test structure is fabricated by first forming an interlevel dielectric across an electrically active area or a pair of electrically active areas that are laterally and dielectrically spaced apart. Select portions of the interlevel dielectric are then removed using optical lithography and an etch step to form openings vertically through the interlevel dielectric to the underlying topography. The resulting openings most likely will be offset from their targeted positions. The openings may then be filled with a conductive material to form plugs. Alternatively, the openings may be left open. A conductive layer is deposited to a varying degree across the plugs or openings. If the openings have not been previously filled with a plug material, they are filled with the conductive layer. Portions of the conductive layer are then etched away to form conductors across each of the plugs or openings (hereinafter referred to as "vias"). The resulting conductors are electrically linked to the vias. A single test pad is coupled to each active area. The test pad is designed to be electrically linked to possibly three different test vias so that even if a relatively large misalignment of the test vias occurs, at least one of the test vias will nonetheless couple to its corresponding active area. Further, the width of the test pad conductor is chosen so as to ensure that it is electrically linked to its corresponding vias despite possible misalignment of its conductor to the vias.

In order to test for optical misalignment of the vias relative to their targeted locations, electrical stimuli is applied, for example, to the test pad, and electrical response is read from a conductor electrically linked to a via. The response is deemed proportional to the distance by which each via is offset from its corresponding active area as fabricated upon the substrate and or semiconductor topography. Some of the electrical responses may be larger than their desired values while others may be smaller. For example, a first via that is targeted to completely overlap an active area may, after lithographic placement, actually exhibit a larger resistance than expected while a second via that is targeted to partially overlap an active area exhibits a lower actual resistance than expected. The observation of such a phenomena indicates that the first via is misaligned in a direction away from its corresponding active area and the second via is misaligned in a direction toward its corresponding active area. Further, the distances of misalignment can be determined by analyzing the variations of the electrical responses from their predicted values. If the resistance measured between a conductor and the test pad is almost negligible, it can be inferred that the via to which the conductor is electrically linked overlaps much of an active area. The distance of misalignment is the distance between the targeted via location and the actual via location, which in this case happens to be positioned over the active area.

BRIEF DESCRIPTION OF THE DRAWINGS

Other objects and advantages of the invention will become apparent upon reading the following detailed description and upon reference to the accompanying drawings in which:

FIG. 2a depicts a cross-sectional view of a first embodiment of the semiconductor topography in which dopants are forwarded into an upper portion of a silicon-based substrate to form an active area, e.g., a source/drain region interposed between isolation regions.

FIG. 2b depicts a cross-sectional view of a second embodiment of the semiconductor topography in which dopants are forwarded into an upper portion of a silicon-based substrate to form active areas, e.g., source/drain regions spaced apart by a isolation regions.

FIG. 4a depicts a top plan view of the first embodiment of the semiconductor topography as processed, wherein vias are formed through the interlevel dielectric down to the topography below and conductors are formed extending from the vias.

Figure 1A:
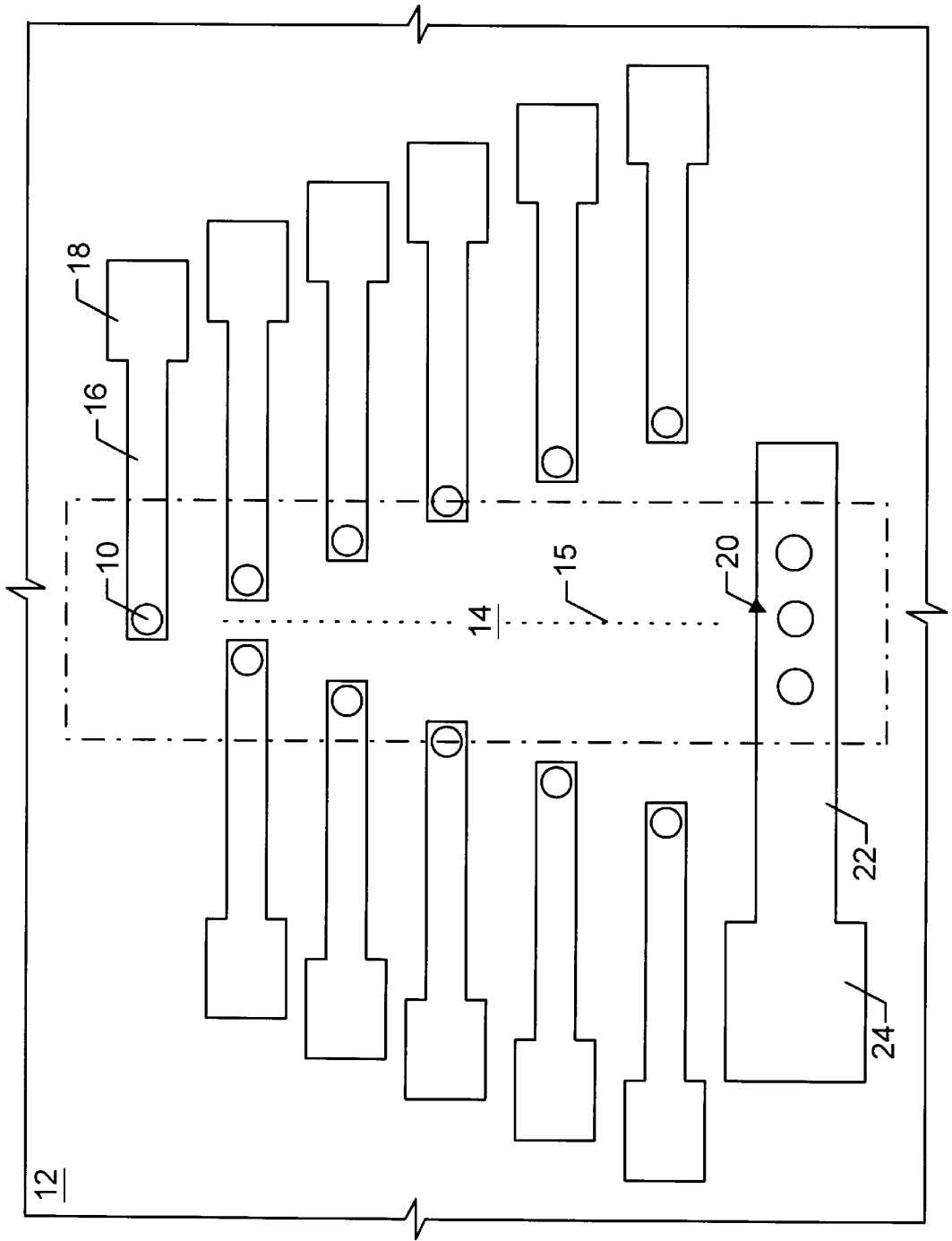
FIG. 1a depicts a top plan view of one embodiment of a targeted test structure according to a design layout in which targeted via areas are positioned at varying distances from a midline of a targeted electrically active area to detect lithographic misalignment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention a; defined by the appended claims.

DETAILED DESCRIPTION OF THE INVENTION

Turning to FIG. 1a, a top plan view of one embodiment of the desired configuration for an alignment test structure is depicted. Targeted via areas 10 extend through an interlevel dielectric 12 to an underlying topography which includes a targeted active area 14. Targeted active area 14 is dielectrically removed from all other active areas (not shown) lying in the same lateral plane. Targeted conductor areas 16 extend across interlevel dielectric 12 and over corresponding targeted via areas 10. The center of each targeted via area 10 is spaced from a midline 15 of targeted active area 14. One of the targeted via areas 10 is positioned directly above midline 15 of targeted active area 14. The rest of the targeted via areas 10 are arranged in pairs on opposite sides of midline 15. Every pair of targeted via areas 10 includes two targeted via areas that are spaced from midline 15 by the same distance but in opposite directions. Different pairs of targeted via areas 10 are purposely offset from midline 15 by varying distances. The offset distance may range between, for example, 0 to 90 nm which is chosen because typical misalignment distances that occur during processing are in this range. Further, the distance may increase by an incremental amount from one targeted pair of via areas to another. For instance, it may increase by increments of 10 nm or 20 nm. Thus, some of targeted via areas 10 may completely or partially overlap targeted active area 14 while others may not contact the active area at all. The test structure may have more targeted via areas and conductor areas than shown in FIG. 1a.

Each of the targeted conductor areas 16 has a minimum width dictated by a need to ensure that the targeted conductor areas 16 are electrically linked to their corresponding targeted via areas 10, despite misalignment of the conductor areas. Probe pads 18 are located where they can contact corresponding conductor areas 16. The test structure also includes three targeted test via areas 20 that extend through interlevel dielectric 12 to targeted active area 14. A targeted test probe pad 24 is electrically coupled to targeted test via areas 20 by a conductive element 22. Three targeted test via areas 20 are used so that at least one of the test via areas will be electrically linked to the active area even when misalignment happens during processing of the test vias.

An electrical signal may be applied to each of the probe pads 18 sequentially while the signal is being applied to test pad 24. When such an electrical signal is applied to one of the probe pads 18 and to test pad 24, the probe pad may be electrically linked to the test pad. Preferably, the electrical signal is in the form of a current applied at a pico- or micro-ampere range. An electrical response, e.g., voltage extracted to resistance may be read each time the electrical signal is applied. The electrical response is proportional to the distance a via area 10 is offset from midline 15 of active area 14. The use of such a small current helps promote a larger change in electrical response given small differences in lithographic misalignment. If currents are too large, variation in electrical response might be too small to detect, especially since a low resistivity material (i.e., plug) may fill targeted via areas 10. According to the design specifications of the test structure in FIG. 1a, the via area that lies along midline 15 should exhibit the largest voltage output while the via area farthest away from midline 15 should exhibit the least given little if any misalignment. Via areas that overlap active area 14 more than other via areas should exhibit largest voltage outputs if the same current stimuli is applied between test pad 24 and all probe pads 18.

Figure 1B:
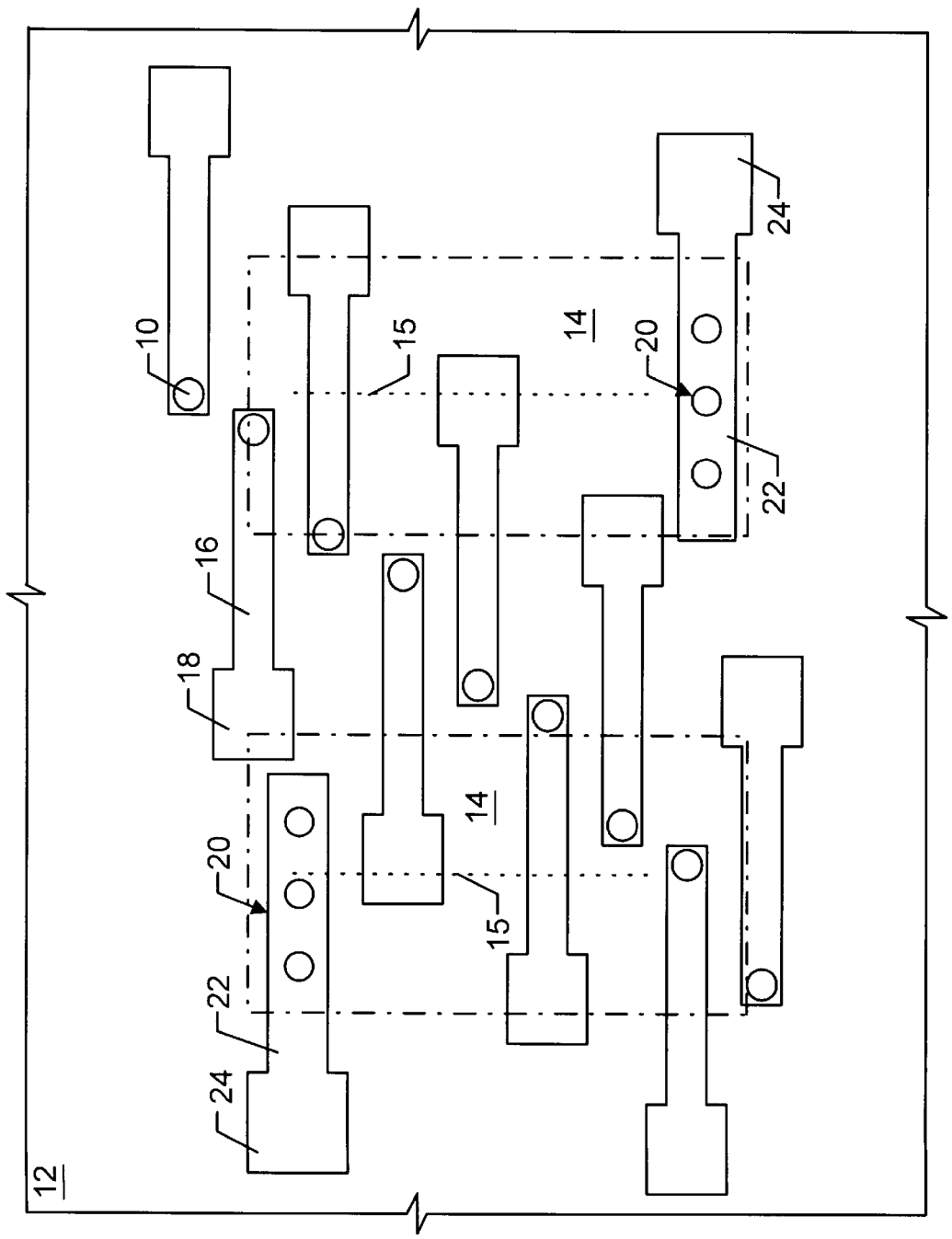
FIG. 1b depicts a top plan view of another embodiment of a targeted test structure according to a design layout in which targeted via areas are positioned at varying distances from midlines of a pair of targeted electrically active areas to detect lithographic misalignment.

FIG. 1b illustrates a top plan view of another embodiment of a layout design for a test structure that may be used to determine optical misalignment of vias with respect to active areas. Targeted via areas 10 of this embodiment extend down to a topography in which two targeted active areas 14 are spaced apart by an isolation region. The center of each targeted via area 10 is spaced by a first distance from a midline 15 of one of the targeted active areas 14 and by a second distance from a midline 15 of another of the targeted active areas 14. The targeted via areas 10 are offset from the two targeted active areas 14 by varying distances. The offset distance from each of the midlines 15 may range between, for example, 0 to 90 nm. Further, the offset distance of the targeted via areas 10 relative to one of the targeted active areas 14 may increase by an incremental amount from one targeted via area to another. Thus, some of targeted via areas 10 may completely or partially overlap one or the other of the targeted active areas 14. On the other hand, some of the targeted via areas 10 may be dielectrically isolated from both of the targeted active areas 14.

As in the previous embodiment, each of the targeted via areas 10 has a probe pad 18 electrically linked to it. Further, each of the targeted active areas 14 has a test pad that electrically contacts it. An electrical stimuli may be applied to each of the probe pads 18 sequentially while the signal is being applied to one of the test pads 24, thereby electrically coupling one of the active areas 14 to the test pad 24. An electrical response may be read each time the electrical signal is applied. This procedure may be applied to both of the active areas 14. The electrical response is proportional to the distance a via area 10 is offset from the midline 15 of the active area 14 to which the electrical signal is electrically linked. According to the design specifications of the test structure in FIG. 1b, the via areas that lie near one of the midlines 15 should exhibit larger voltage outputs than via areas shifted away from both active areas 14—given little if any misalignment and if the same current stimuli is applied between test pads 24 and all probe pads 18.

Turning to FIG. 2a, the first step in the fabrication of the alignment test structure layout shown in FIG. 1a is depicted. A single crystalline silicon substrate 26 is provided which includes a pair of isolation regions 28 formed at select locations within substrate 26. Isolation regions 28 may be formed by etching away portions of substrate 26 followed by filling the trenches with a dielectric material, such as a deposited oxide. Excess portions of the oxide may be removed from the surface of substrate 26 using a chemical-mechanical polishing step or a sacrificial etchback technique. The trench etch and fill technique is often referred to as the shallow trench isolation process. A source/drain ("S/D") implant is then forwarded into an upper portion of substrate 26 to form a S/D (or active) area 14 that is interposed between isolation regions 28. Dopants entering isolation regions 28 are unable to migrate to the substrate therebelow since the bonded atoms within those regions block diffusion pathways of the dopants. Alternately, region 14 may be a conductive layer and region 26 may be an interlevel dielectric arranged above another conductive layer or a gate conductor. However, the alternate configuration is less preferred since simplicity of the test structure is desired.

Figure 3A:
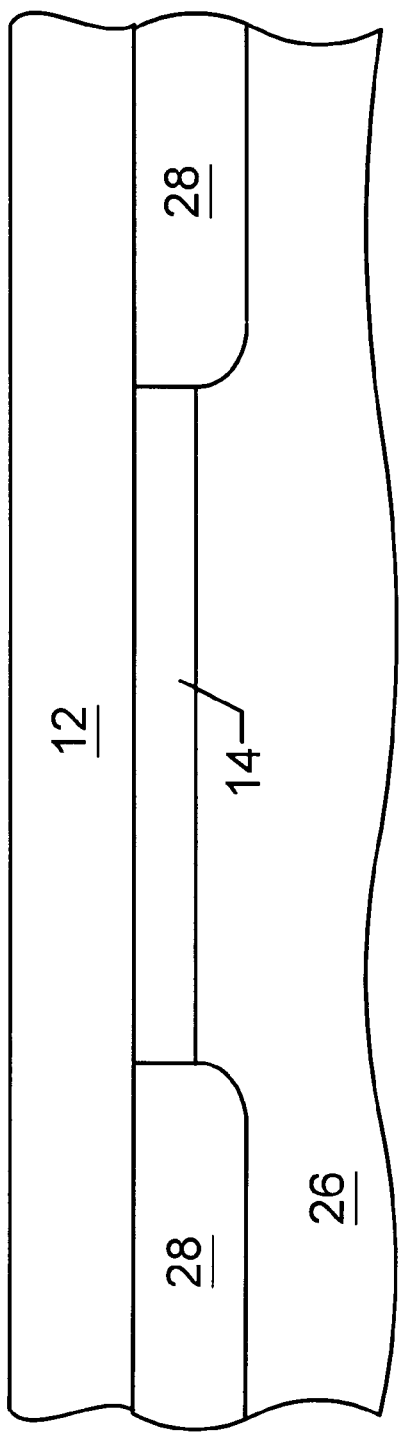
FIG. 3a depicts a cross-sectional view of the first embodiment of the semiconductor topography, wherein an interlevel dielectric is formed across the active area and the isolation regions.
Figure 3B:
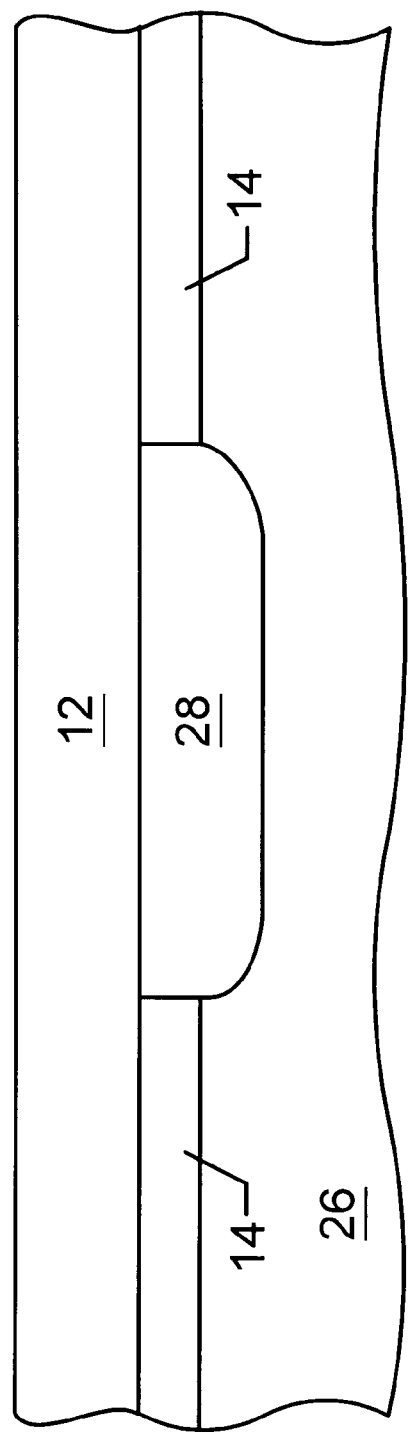
FIG. 3b depicts a cross-sectional view of the second embodiment of the semiconductor topography, wherein an interlevel dielectric is formed across the active areas and the isolation regions.

FIG. 2b depicts the first step in the fabrication of the alignment test structure layout shown in FIG. 1b. A single isolation region 28 is arranged within the upper surface of substrate 26. Isolation region 28 of FIG. 2b is formed similarly to isolation regions 28 of FIG. 2a. A S/D implant is forwarded into areas of substrate 26 laterally adjacent to isolation region 28 to form a pair of S/D (or active) areas 14 which are separated by isolation region 28. FIG. 3a and 3b illustrates an interlevel dielectric 12 being formed across isolation region(s) 28 and active area(s) 14 for both embodiments of the test structure. Interlevel dielectric 12 may be formed by the deposition of ar oxide- or glass-based material.

FIG. 4a, shows one possible embodiment of the test structure depicted in FIG. 1a, and the relationship of various features of that test structure, after fabricition upon a semiconductor topography. The formation of such a test structure is completed by first forming openings 10 and 20 vertically through interlevel dielectric 12 to the underlying topography which includes active area 14, subsequent to the step depicted in FIG. 3a. Openings 10 and 20 are formed by patterning a photoresist masking layer (not shown) above interlevel dielectric 12 using lithography. Portions of interlevel dielectric 12 that are not covered by the patterned photoresist layer may be removed using a plasma etch step. Etch duration is selected to last until regions of the surface of the underlying topography are exposed by the removal of the overlying dielectric material. A conductive material, such as aluminum may then be deposited across interlevel dielectric 12 and into openings 10 and 20. A plasma etch may be used to remove portions of the conductive material, resulting in the formation of conductors 16/coupled to probe pads 18 and conductor element 22 coupled to test pad 24. Alternately, plugs may be formed within openings 10 and 20 prior to the formation of conductive elements above interlevel dielectric 12. The formation of such plugs involves the deposition of a conductive material, such as tungsten into openings 10 and 20 and across interlevel dielectric 12. A portion of the deposited material may then be removed using, e.g., chemical mechanical polishing ("CMP") or sacrificial etchback. CMP results in the upper surface of the plug material arranged within openings 10 and 20 being level with the upper surface of interlevel dielectric 12.

The resulting vias 10 (previously openings 10) may be misaligned from their targeted positions as shown. Vias 10 are shifted to the right of their desired locations (see targeted via areas 10 in FIG. 1a). Fortunately, the direction of this shift and the misalignment distance may be determined. Probe pads 18 are positioned where they can electrically communicate with vias 10, and test pad 24 is electrically linked to active area 14. Thus, an electrical signal may be applied to each of the conductor probes pads 18 sequentially and to test pad 24. The electrical response reading of resistance or voltage may be compared to the predicted resistance or voltage, respectively. In the present example, the rightmost vias of the via pairs exhibit lower voltage outputs than expected. Further, the bottom three vias of the leftmost vias exhibit higher voltage outputs than expected because they are shifted such that they at least partially overlap active area 14. However, the top two vias of the leftmost vias and the topmost via of all the vias 10 exhibit voltage outputs similar to what was expected from them. Even through they are shifted from their targeted locations, these vias still overlap active area 14 completely. Based on these observations, it can be inferred that vias 10 are misaligned from their targeted locations in a rightward direction. Further, the distance that each via is misaligned from its targeted location may be determined since some of the electrical response readings are as predicted while others are dissimilar from their predicted values. In another embodiment, the test structure layout of FIG. 1a may be rotate, 90 degrees to the right or the left. A test structure fabricated according to this orientation may be used to detect vertical misalignment.

Figure 4B:
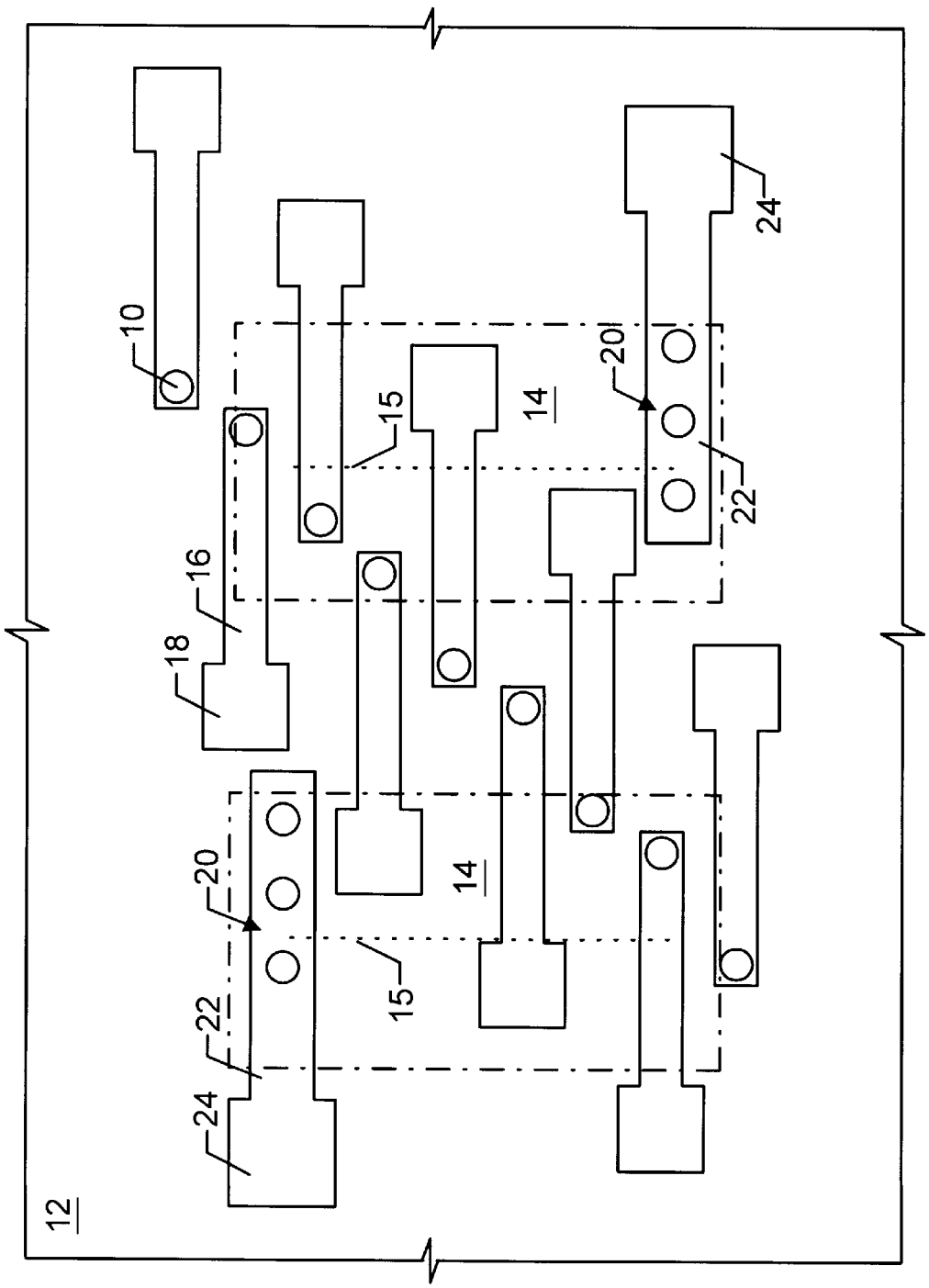
FIG. 4b depicts a cross-sectional view of the second embodiment of the semiconductor topography as processed, wherein vias are formed through the interlevel dielectric down to the topography below and conductors are formed extending from the vias.

FIG. 4b illustrates a possible embodiment of the test structure depicted in FIG. 1b after fabrication upon a semiconductor topography. Following the step depicted in FIG. 3a, this test structure undergoes fabrication steps similar to those described above for FIG. 4a. Vias 10, however, are positioned according to the layout in FIG. 1b, except that they are shifted to the right of their desired locations (see targeted via areas I0 of FIG. 1b) due to optical misalignment. Also, a test pad 24 is electrically linked to each of the active areas 14. To determine misalignment direction and misalignment distances of vias 10 with respect to active areas 14, an electrical signal may be applied to each of the probe pads 18 and each of the test pads 24, respectively. In the present example, the forth via 10 from the top exhibits a lower resistance than predicted when a currents is applied to test pad 24 of the rightmost active area 14. Further, the sixth and seventh vias from the top exhibit a higher resistance than predicted since they are shifted to the isolation region between active areas 14. The test structure layout shown in FIG. 1b may also be used to determine vertical misalignment of the vias. For example, the test structure may be fabricated such that the second via from the top exhibits a higher resistance than expected and the lowest via exhibits a lower resistance than expected. From these results, it can be inferred that the vias are shifted upward from their desired locations.

It will be appreciated to those skilled in the art having the benefit of this disclosure that this invention is believed to provide a method for determining lithography misalignment of a via with respect to an electrically active area. It is intended that the following claims be interpreted to embrace all such modifications and changes and, accordingly, the specification and drawings are to be regarded in an illustrative rather than a restrictive sense.

What is claimed is:

1. A targeted alignment test structure, comprising:
   a targeted first via area shifted a first distance from a first midline of a targeted first electrically active area;
   a targeted second via area shifted a second distance from said first midline, said second distance being dissimilar from said first distance;
   a test pad electrically communicating with said targeted first electrically active area; and
   a targeted third via area shifted said second distance from said first midline, wherein said targeted second via area is shifted from said first midline in a first direction, and wherein said targeted third via area is shifted from said first midline in a second direction opposite to said first direction.

2. The alignment test structure of claim 1, further comprising a targeted first conductor area electrically coupled to said targeted first via area and a targeted second conductor area electrically coupled to said targeted second via area.

3. The alignment test structure of claim 1, further comprising first additional targeted via areas shifted first varying distances from said first midline in a first direction, and further comprising second additional targeted via areas shifted second varying distances from said first midline in a second direction, wherein said first direction is opposite to said second direction.

4. The alignment test structure of claim 3, wherein one portion of said first and second additional targeted via areas contact said targeted first active area, and wherein another portion of said additional targeted via areas are dielectrically removed from said targeted first active area.

5. The alignment test structure of claim 1, further comprising a targeted second electrically active area dielectrically spaced from said targeted first active area, wherein said targeted first via area is shifted a second distance from a second midline of said targeted second active area.

6. The alignment test structure of claim 5, further comprising additional targeted via areas shifted first varying distances from said first midline of said targeted first active area and shifted second varying distances from said second midline of said targeted second active area.

7. The alignment test structure of claim 1, wherein the targeted first and second via areas are connected to targeted first and second conductive areas, respectively, and wherein the targeted first and second via areas, along with the targeted first and second conductive areas laterally shift from their targeted locations during fabrication of the alignment test structures to produce first and second vias and first and second conductors which correspond to the first and second via areas and the first and second conductor areas, respectively.

8. The alignment test structure of claim 7, wherein the test pad, along with the first and second conductors, are each adapted to receive an electrical signal.

9. The alignment test structure of claim 8, wherein the electrical signal produces a voltage between the first conductor and the test pad that is different than another voltage value between the second conductor and the test pad.

10. The alignment test structure of claim 9, wherein the amount of difference between said voltage and said another voltage is dependent upon the amount of lateral shift.

* * * * *